United States Patent [19]

Kitagawa et al.

[11] Patent Number: 4,869,776

[45] Date of Patent: Sep. 26, 1989

[54] METHOD FOR THE GROWTH OF A COMPOUND SEMICONDUCTOR CRYSTAL

[75] Inventors: Masahiko Kitagawa, Tenri; Yoshitaka Tomomura, Nara; Satoshi Yamaue, Nara; Shigeo Nakajima, Nara, all of Japan

[73] Assignee: Sharp Kabushiki Kaisha, Osaka, Japan

[21] Appl. No.: 78,564

[22] Filed: Jul. 28, 1987

[30] Foreign Application Priority Data

Jul. 29, 1986 [JP] Japan ................. 61-179624
Jul. 31, 1986 [JP] Japan ................. 61-181791

[51] Int. Cl.⁴ .................. C30B 23/06; H01L 21/20
[52] U.S. Cl. .................. 156/610; 156/609; 156/612; 437/81; 437/104
[58] Field of Search ............... 156/609, 610, 612, 615; 437/104, 81

[56] References Cited

U.S. PATENT DOCUMENTS

| | | | |
|---|---|---|---|
| 3,200,018 | 8/1965 | Grossman | 156/610 |
| 4,439,266 | 3/1984 | Gentile et al. | 156/614 |
| 4,695,347 | 9/1987 | Fischer | 156/610 |
| 4,699,688 | 10/1987 | Shastry | 156/610 |

FOREIGN PATENT DOCUMENTS

| | | |
|---|---|---|
| 963158 | 3/1962 | United Kingdom . |
| 929559 | 4/1962 | United Kingdom . |
| 1065074 | 4/1964 | United Kingdom . |
| 1432240 | 4/1973 | United Kingdom . |
| 1598051 | 1/1978 | United Kingdom . |

OTHER PUBLICATIONS

Tairov et al.; "Progress in Controlling the Growth of Polytypic Crystals"; V. I. Ulyanov (Lenin) Electrical Engineering Institute, Leningrad, P-22, 197022 USSR; Aug. 24, 1982; pp. 111-161.

Primary Examiner—William R. Dixon, Jr.
Assistant Examiner—Anthony J. Green
Attorney, Agent, or Firm—Irell & Manella

[57] ABSTRACT

A method for the growth of a compound semiconductor crystal using the sublimation method or the halogen transportation method, comprising maintaining the temperature of a limited portion of the crystal, which has just begun to grow, at a higher level than that of the crystal growth temperature, thereby attaining control of the crystallinity of the crystal at the initial growth stage, and an apparatus for the said method.

3 Claims, 3 Drawing Sheets

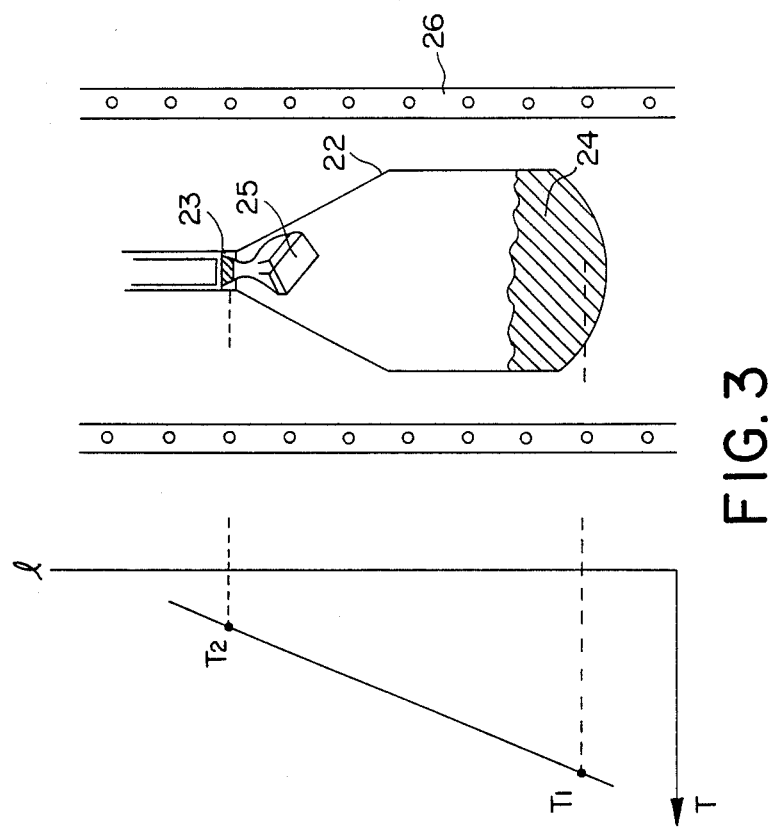

METHOD FOR THE GROWTH OF A COMPOUND SEMICONDUCTOR CRYSTAL

BACKGROUND OF THE INVENTION

1. Field of the invention:

This invention relates to a method for the growth of single bulk crystals of compound semiconductors such as ZnS, ZnSe, ZnTe, etc., using the sublimation method or the halogen transportation method, and an apparatus used for the said crystal growth method.

2. Description of the prior art:

The vapor phase transportation method in which crystal materials are transported to a seed crystal by the use of halogen gas is preferably used as a single crystal growth method. According to the vapor phase transportation method, even compounds such as ZnS, etc., having a transition point of about 1020° C. that is below the melting point (about 1830° C.) thereof are grown at a low temperature (e.g., below 1000° C.), so that the passage at the transition point and/or the mixing of polytyped crystals into the single crystal, which may arise in the fusing method in which the compounds are grown at a high temperature (e.g., 1800° C.) under a high pressure (e.g., several tens of atmosphere), can be avoided. Therefore, the vapor phase transportation method in which halogen gas is used as a transporting agent is important to the growth of a single bulk crystal of the above-mentioned compounds. However, since halogen elements (i.e., I, Br, Cl and F) are active even at room temperature (namely, I and Br have a high vapor pressure at room temperature and Cl and F are gaseous at room temperature), a charging process for the charge of a crystal growth vessel with halogen elements becomes complicated. Moreover, it is difficult to accurately add a given amount of halogen to the growth vessel without contamination by foreign substances, while the inside of the growth vessel is maintained at a high vacuum level (e.g., less than $10^{-6}$ Torr) in the charging process. In order to remove these problems, an approach in which the volume of halogen required to provide a given amount after vaporization is measured in advance or an approach in which a given amount of halogen is sealed within a small ampule and then the ampule is added to the growth vessel together with crystal materials has been proposed. The former approach requires measurements of a volume of halogen which necessitate vaporization of halogen using a heating process and solidification of halogen using liquid nitrogen, which causes difficulties in preventing the mixing of water vapor and/or air into the growth vessel in the halogen-charging process. In the latter approach, loss in halogen arises when the halogen-ampule is sealed, resulting in an incorrect amount of halogen. Accordingly, these approaches cannot attain the addition of an accurate amount of halogen with reproducibility to the growth vessel.

As mentioned above, in the vapor phase transportation method in which halogen is used as a transporting agent, prevention of mixing gases such as water vapor, air, etc., into the growth vessel when the growth vessel is charged with halogen is difficult in light of the physical properties of halogen, so that the amount of halogen to be added to the growth vessels cannot be maintained at a fixed value for each vessel, which causes difficulties in establishment of reproduceable crystal growth conditions, resulting in an extremely reduced amount of crystal materials to be transported by the halogen or in the growth of polytype crystals.

In order to solve the above-mentioned problems, a crystal growth method has been proposed in which, as shown in FIG. 3, the temperature distribution is maintained to be in the range of $T_1$ to $T_2$ and ampules with a specific design is used, and moreover the seed crystal growth section 23 are separated from the single crystal growth section 25 within the growth vessel 22 so as to regulate the crystal growth. Reference numerals 24 and 26 indicate a crystal material and a heater, respectively. Since this method adopts such a crystal growth environment in which the temperature distribution is in a fixed range of $T_1$ to $T_2$ so as to improve the reproducibility of the crystal growth, when the conditions under which halogen is supplied to ampules are different and/or water vapor, air, etc., are mixed into the growth vessel, distorted crystals that are inferior in crystallinity are produced. Moreover, if the growth conditions (including the supply of halogen to ampules, growth temperatures, etc.), are changed in view of the physical property control, there is a possibility that they will vary from the optimal single crystal growth conditions. These problems are caused by the phenomenon that distortions of crystals arising from the beginning crystal growth are taken over by the succeeding crystal growth.

SUMMARY OF THE INVENTION

The method for the growth of a compound semiconductor bulk crystal, using the sublimation method or the halogen transportation method, of this invention, which overcomes the above-discussed and numerous other disadvantages and deficiencies of the prior art, comprises maintaining the temperature of a limited portion of the crystal, which has just begun to grow, at a higher level than that of the crystal growth temperature, thereby attaining control of the crystallinity of the crystal at the initial growth stage.

In a preferred embodiment, temperature control is performed using a first heater which creates a temperature distribution over the whole area within a crystal growth vessel including both the crystal growth region and the crystal material storage region and a second heater which controls the temperature of a limited area within the crystal growth vessel corresponding to the desired portion of the crystal that has just begun to grow.

In a more preferred embodiment, transporting mediums used in said halogen transportation method are compounds made of a metallic or submetallic element and a halogen element, said halogen compounds being chemically stable at room temperature and being decomposed at a temperature that is lower than the crystal growth temperature.

The apparatus for the growth of a compound semiconductor crystal, using the sublimation method or the halogen transportation method, of this invention, comprises a crystal growth vessel, a first heater that is wound around the body of the vessel, and a second heater that is disposed movably up and down in a space between the first heater and the vessel, said first heater creating a temperature distribution over the whole area within the vessel and the second heater controlling the temperature of a limited area within the vessel corresponding to the desired portion of a crystal that has just begun to grow.

Thus, the invention described herein makes possible the objects of (1) providing a method for the growth of compound semiconductor crystals in which halogen compounds that meet a specific requirement are used as a transporting medium, thereby attaining extreme simplification of the process for the preparation of ampules required for crystal growth and creating reproduceable inner conditions of the ampules, which results in good quality single bulk crystals on a large scale that are reproduceable; (2) providing a method for the growth of compound semiconductor crystals in which the beginning conditions of the single bulk crystal growth of the II-VI group compound semiconductors such as ZnS, ZnSe, etc., are controlled in a given space for a given period of time, so that a good quality single bulk crystal can be grown with reproducibility; (3) providing a method for the growth of compound semiconductors in which a local portion of the beginning crystal growing from a seed crystal is heated to a high temperature so as to soften the effects of changes in the supersaturation of crystal material gases and/or the effects of the gas flowing on the crystal growth, resulting in a good quality crystal in which distortion has been minimized before the crystal growing from the seed crystal becomes thick, so that the progress of an excellent single-crystal growth can be effected in the succeeding bulk crystallization; and (4) providing an apparatus with a double heating structure for the above-mentioned method, by which despite the difference in the beginning conditions of the single bulk crystal growth for each sample, a good quality single bulk crystal can be grown with reproducibility.

BRIEF DESCRIPTION OF THE DRAWINGS

This invention may be better understood and its numerous objects and advantages will become apparent to those skilled in the art by reference to the accompanying drawings as follows:

FIG. 3 is a schematic diagram showing an apparatus used in a conventional method for the growth of single bulk crystals.

DESCRIPTION OF THE PREFERRED EMBODIMENTS

Figure 1:
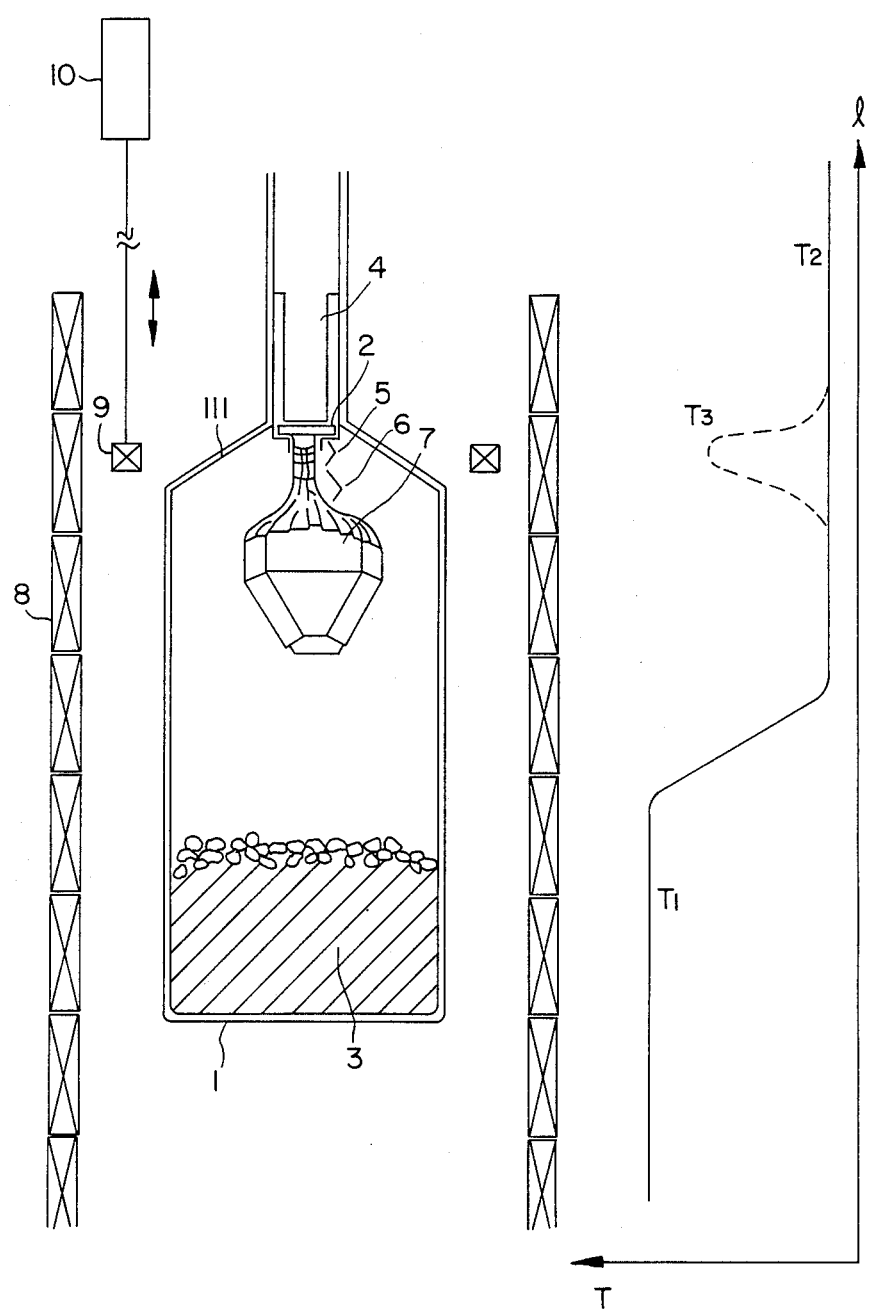
FIG. 1 is a schematic diagram showing the basic structure of an apparatus of this invention.

According to a crystal growth technique using a vapor phase of this invention, the growth of crystals onto a seed crystal progresses depending upon the supersaturation of the crystal material in the low temperature zone in the crystal growth vessel, and accordingly time and spacial changes in the supersaturation of the crystal material influence crystallization of the crystal material, resulting in the growth of crystals containing single crystals, skeleton crystals, dendrites, etc. Especially, when the vapor flows, the supersaturation of the crystal material varies depending upon a variation in temperatures, temperature gradient, time and spatial variation in the vapor flow, and non-uniformity of the vapor flow. The above-mentioned variables within a growth apparatus arise in a transient state of the beginning of the growth stage in light of crystal growth theory, and control in the beginning crystal growth stage is especially important to obtain good quality single bulk crystals.

The main feature of this invention is in that the supersaturation of the crystal material is controlled (that is, time and spatial changes in the supersaturation of the crystal material are reduced) by heating a limited area within the growth vessel corresponding to the desired portion of crystals growing at the beginning, to a temperature that is higher than the temperature at which single crystals grow, so that distortion of crystals arising from the beginning growth can be reduced, which makes possible the progress of a stable growth of good quality crystals onto a seed crystal.

Another feature of this invention is to provide an apparatus with a double heating structure constituted by a first heater that creates a given temperature distribution and a second heater that creates a higher temperature distribution in a limited area within the growth vessel that can be selected as desired in such a manner that the higher temperature distribution formed by the second heater is superposed on the lower temperature distribution formed by the first heater. More particularly, the temperature distribution composed of a material temperature at which the crystal material is vaporized and a growth temperature (this temperature being lower than the material temperature) at which single crystals grow is created by the first heater. Under this temperature condition, crystals grow onto a seed crystal. When the crystals extend to a certain length from the seed crystal, a limited portion of the crystals from the top is heated by the second heater so as to regulate a difference between the crystal surface temperature and the material temperature. The crystals are further heated until they extend to a given length from the seed crystal, and then the operation of the second heater is stopped, after which the growth of the crystals progresses by the use of the first heater alone, resulting in uniform and good quality crystals.

Another feature of this invention is to use halogen compounds that are stable at room temperature and that generate halogen gases at a crystal growth temperature, instead of halogens that are unstable at room temperature at which crystal growth ampules are prepared, as a halogen transporting medium of the vapor phase transportation method. Halogens (i.e., I, Br, Cl and F) that exist in a solid, liquid or gaseous form at room temperature are unstable, which makes their manipulation difficult. If certain halogen compounds XAn (wherein X is the metallic or submetallic elements, A is the halogens and n is an integer such as 1, 2, 3, etc.) that are stable at a temperature in the range of 0° to about 200° C. at which ampules are prepared and that generate halogen gases by thermal decomposition at a growth temperature above 700° C. are selected, the abovementioned problems will be solved. Since the compounds XAn are stable at room temperature, it is possible to set an accurate amount of halogens to be added to the vessel. It is also possible to create a sufficient vacuum of less than $10^{-6}$ Torr inside of the ampules. Moreover, the preparation of the ampules and the equipment therefor can be simplified. In this way, the growth conditions under which single bulk crystals of compound semiconductors grow can be set so that such single bulk crystals can be easily reproduceable.

EXAMPLE 1

This example discloses a method for the growth of single crystals of ZnS and ZnSe using iodine as a transporting medium. This example also discloses a crystal growth apparatus.

FIG. 1 shows the basic structure of a crystal growth apparatus of this invention, using iodine as a transporting medium. The apparatus comprises a growth vessel 111, a first heater 8 that is wound around the body of the vessel 111, and a second heater 9 that is disposed movably up and down in a space between the first heater 8 and the vessel 111. The body of the vessel 111 is constituted by a quartz ampule 1, in which a seed crystal 2, a bulk single crystal 7, etc., are disposed in the upper area and a crystal material 3 such as ZnS or ZnSe is placed in the lower area. The quartz ampule 1 is of a cylindrical shape with a diameter of 30 mm and a length of 100 mm. A heat sink 4 is disposed above the seed crystal 2 in a manner to be in contact with the seed crystal 2. The second heater 9 is connected to a driving system 10 by which the second heater 9 moves up and down. The seed crystal 2 faces the growth space through a hole that is formed in the upper wall of the quartz ampule 1 and a crystal grows through the hole.

The quartz ampule 1 is heated by the first heater 8 to create a temperature distribution over the whole area within the quartz ampule 1 including the crystal material storage region of a temperature $T_1$ and the crystal growth region of a temperature $T_2$, and the crystal growth begins. That is, when the crystal material 3 is heated to a temperature $T_1$, it is vaporized together with iodine gas as a transporting medium. As a result, the vaporized crystal material is carried to the seed crystal 2 and deposited thereon. When the crystal grows on the seed crystal 2 to a length of about 5 mm (this state being indicated as a reference numeral 5 in FIG. 1), the second heater 9 operates to heat a limited area within the quartz ampule 1 corresponding to the desired portion of the fine crystal 5 to a temperature $T_3$ ($T_3 > T_2$). Under these temperature conditions, the fine crystal 5 continues to grow until the length of the crystal 5 becomes 10 to 15 mm. The desired portion of the crystal 5 obtains thermal energy by being heated to a temperature $T_3$, so that the mismatch in crystal configuration and/or the crystal defect disappears due to atomic motion by which surface diffusion and/or a lattice match can be carried out. The instability at the initial growth stage can be almost eliminated at the time when the length of the fine crystal 5 becomes greater than 10 mm, and heat from the second heater 9 is reduced or stopped at once and the growth of a single crystal of ZnS or ZnSe further progresses at the growth temperature $T_2$ which is attained using mainly the first heater 8. By the above-mentioned heating process, the occurrence of defects in the growing crystal can be prevented, resulting in the growth of a good quality crystal 7.

The second heater 9 which is movable up and down can heat a desired portion of the crystal in order to prevent uneven growth of the crystal, so that even when accidental changes in the shape of the crystal arise during growth, heating control can be performed by the second heater 9, which makes the regrowth of a single crystal possible.

Figure 2:
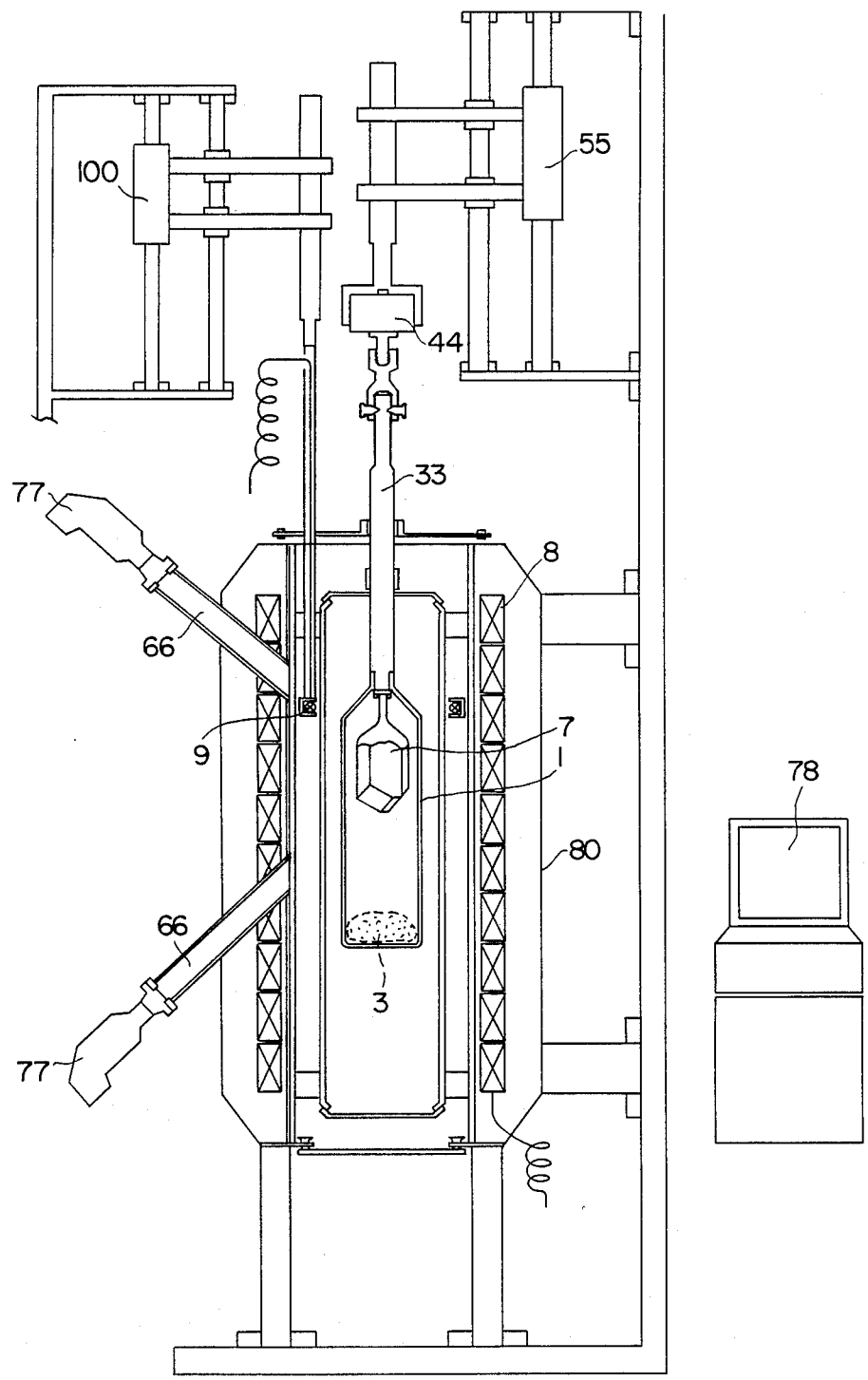
FIG. 2 is a schematic diagram showing an apparatus used in the method for the growth of single bulk crystals of this invention.

The structure of the above-mentioned apparatus is shown in detail in FIG. 2, in which the ampule 1 is connected to a positioning means 44 by a supporting rod 33 and a motor 55. The ampule 1 is positioned in a desired region within the furnace 80. The second heater 9 is also connected to a positioning means 100 by which the second heater 9 is positioned at a desired location to heat a limited area of the crystal during growth. The crystal within the ampule 1 can be observed through windows 66 to which TV cameras 77 are connected. This apparatus can be connected to a computer system 78 by which the growth of crystals is monitored, the crystal growth is automatically controlled to attain optimal conditions, and the data obtained with regard to the single crystal growth are collected and recorded.

EXAMPLE 2

This example discloses a method for the growth of a single crystal of ZnS and ZnSe, using iodine compounds such as AgI (the decomposition temperature thereof being 552° C.), $BiI_3$ (the decomposition temperature thereof being 500° C.), $GeI_4$ (the decomposition temperature thereof being 375° C.), etc., as a transporting medium. Each iodine compound is stable at room temperature (that is, it has a low vapor pressure at room temperature) and a certain amount of iodine compound that corresponds to the amount of halogen to be required as a transporting medium can be accurately weighed. The weighed iodine compound is added to an ampule together with a crystal material. The ampule is then subjected to a crystal growth process using the halogen transportation method. The crystal material such as ZnS or ZnSe is vaporized, as mentioned in Example 1, together with iodine gas generated from the iodine compound and grown onto a seed crystal or a nucleus that has spontaneously generated, resulting in a good quality single bulk crystal of ZnS or ZnSe. Temperature control as described in Example 1 is carried out as needed.

When AgI or $BiI_3$ is used as a transporting medium, since Ag is a monad and Bi is a pentad and they function as an acceptor impurity against ZnS and ZnSe, both of which are a II-VI group compound semiconductor, they compensate I, a donor impurity, to thereby control the conductivity, resulting in a ZnS or ZnSe single bulk crystal having sufficiently high electrical resistance.

EXAMPLE 3

A single-crystal growth of ZnS and ZnSe by the halogen transportation method using bromine as a transporting medium has not yet been reported, but, in this example, $SeBr_4$ (the decomposition temperature thereof being 75° C.) was used, instead of bromine, as a transporting medium by the same method as in Example 2, resulting in single crystals of ZnS and ZnSe, respectively, grown with reproducibility.

EXAMPLE 4

Instead of iodine that is used in the halogen transportation method, chlorine compounds such as $PtCl_4$ (the decomposition temperature thereof being 370° C.) and $TiCl_3$ (the decomposition temperature thereof being 440° C.) were used as a transporting medium in a method for the growth of a single bulk crystal of this example, and good quality single bulk crystals of ZnS and ZnSe, were respectively grown.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the growth of a compound semiconductor crystal using the sublimation method or the halogen transportation method, consisting essentially of maintaining the temperature of a limited portion of the crystal, which has just begun to grow, at a higher level than that of the crystal growth temperature, thereby attaining control of the crystallinity of the crystal at the initial growth stage, wherein temperature control is performed using a fixed first heater which creates a temperature distribution over the whole area within a crystal growth vessel including both a crystal growth region and a crystal material storage region; and a moveable second heater which is positioned at the desired portion of the crystal that has just begun to grow and controls the temperature of a limited area within said crystal growth vessel corresponding to the desired portion of the crystal that has just begun to grow.

2. A method according to claim 1, wherein transporting mediums used in said halogen transportation method are halogen compounds made of a metallic or submetallic element and a halogen element, said halogen compounds being chemically stable at room temperature and being decomposed at a temperature that is lower than the crystal growth temperature.

3. A method according to claim 1, wherein said compound semiconductor crystal is composed of group II elements and Group VI elements, said crystal growth temperature being in the range of 750° C. to 1250° C. and said temperature of a limited portion of the crystal being in the range of 755° C. to 1300° C.

* * * * *